(12) United States Patent
Zuo et al.

(10) Patent No.: US 11,063,599 B2
(45) Date of Patent: Jul. 13, 2021

(54) APPARATUS AND METHOD FOR AUTOMATIC SEARCH OF SUB-SAMPLING PHASE LOCKED LOOP (SS-PLL) LOCKING ACQUISITION

(71) Applicant: Samsung Electronics Co., Ltd., Gyeonggi-do (KR)

(72) Inventors: Yongrong Zuo, Santa Clara, CA (US); Chih-Wei Yao, Saratoga, CA (US); Wanghua Wu, Santa Clara, CA (US)

(73) Assignee: Samsung Electronics Co., Ltd

( * ) Notice: Subject to any disclaimer, the term of this patent is extended or adjusted under 35 U.S.C. 154(b) by 0 days.

(21) Appl. No.: 16/516,581

(22) Filed: Jul. 19, 2019

(65) Prior Publication Data

US 2020/0343898 A1    Oct. 29, 2020

Related U.S. Application Data

(60) Provisional application No. 62/837,398, filed on Apr. 23, 2019.

(51) Int. Cl.
| | | |
|---|---|---|
| *H03L 7/099* | (2006.01) | |
| *H03K 17/687* | (2006.01) | |
| *H04L 7/033* | (2006.01) | |
| *H01L 29/78* | (2006.01) | |

(52) U.S. Cl.
CPC ........ *H03L 7/0996* (2013.01); *H01L 29/7833* (2013.01); *H03K 17/687* (2013.01); *H03L 7/0992* (2013.01); *H04L 7/0331* (2013.01); *H03L 2207/05* (2013.01); *H03L 2207/06* (2013.01)

(58) Field of Classification Search
CPC . H03L 7/0996; H03L 7/0992; H03L 2207/06; H03L 2207/05; H03K 17/687; H04L 7/0331; H01L 29/7833
See application file for complete search history.

(56) References Cited

U.S. PATENT DOCUMENTS

| | | | |
|---|---|---|---|
| 6,356,160 B1 | 3/2002 | Robinson et al. | |
| 7,005,902 B2 | 2/2006 | Choi | |
| 9,608,644 B1* | 3/2017 | Raj | .......... H03L 7/095 |
| 2013/0156076 A1* | 6/2013 | Kinget | ........... H04L 27/18 |
| | | | 375/219 |
| 2018/0302069 A1 | 10/2018 | Loke et al. | |
| 2018/0337683 A1 | 11/2018 | Mateman | |
| 2019/0212703 A1* | 7/2019 | Yao | ............. H03L 7/1976 |

OTHER PUBLICATIONS

X. Gao, et. al., "A Low Noise Sub-Sampling PLL in Which Divider Noise is Eliminated and PD/CP Noise is Not Multiplied by N2", IEEE Journal of Solid State Circuits, vol. 44, No. 12, pp. 3253-3263, Dec. 2009.

\* cited by examiner

*Primary Examiner* — Kabir A Timory
(74) *Attorney, Agent, or Firm* — The Farrell Law Firm, P.C.

(57) ABSTRACT

An apparatus and method are provided. The apparatus includes a phase locked loop (PLL) configured to generate a reference signal; a sub-sampling PLL (SS-PLL) connected to the PLL and configured to sub-sample the reference signal; and a first pre-charge circuit connected to the SS-PLL and configured to allow an output voltage of the SS-PLL to transition to an operating voltage to indicate that a difference between two voltage inputs is zero on average.

26 Claims, 17 Drawing Sheets

APPARATUS AND METHOD FOR AUTOMATIC SEARCH OF SUB-SAMPLING PHASE LOCKED LOOP (SS-PLL) LOCKING ACQUISITION

PRIORITY

This application claims priority under 35 U.S.C. § 119(e) to a U.S. Provisional Patent Application filed on Apr. 23, 2019 in the United States Patent and Trademark Office and assigned Ser. No. 62/837,398, the entire contents of which are incorporated herein by reference.

FIELD

The present disclosure relates generally to an electronic circuit, and more particularly, to an apparatus and method for automatic search for sub-sampling PLL (SS-PLL) locking acquisition.

BACKGROUND

An SS-PLL is used for frequency synthesis in communication systems due to its excellent phase noise performance. However, the SS-PLL cannot distinguish between different harmonics of a reference frequency and has very limited frequency acquisition range due to the sinusoidal characteristic of a sub-sampling phase detector (SSPD) or sampler.

For an SS-PLL to lock successfully and reliably, a voltage-controlled oscillator (VCO) frequency of the PLL must be very close to the locking frequency with the aid of an additional frequency locking loop (FLL) or a digital counter/calibrator. Generating such a VCO frequency is challenging for an SS-PLL running at tens of giga-Hertz (GHz) for applications such as millimeter wave (mmWave) applications. Besides the frequency accuracy requirement, any disturbance or charge re-distribution during switching from an FLL or a digital counter to an SS-PLL may shift the VCO frequency out of the narrow locking range of the SS-PLL.

SUMMARY

According to one embodiment, an apparatus includes a PLL configured to generate a reference signal; an SS-PLL connected to the PLL and configured to sub-sample the reference signal; and a first pre-charge circuit connected to the SS-PLL and configured to allow an output voltage of the SS-PLL to transition to an operating voltage to indicate that a difference between two voltage inputs is zero on average.

According to one embodiment, an apparatus includes a PLL configured to generate a reference signal; an SS-PLL connected to the PLL and configured to sub-sample the reference signal; a first pre-charge circuit connected to the SS-PLL and configured to allow an output voltage of the SS-PLL to transition to an operating voltage to indicate that a difference between two voltage inputs is zero on average; a frequency locking loop (FLL) connected to the SS-PLL; a switch connected between the FLL and an output of the SS-PLL; and a coarse tuner connected between the output of the SS-PLL and an input of the SS-PLL.

According to one embodiment, a method includes generating, by a phase locked loop (PLL), a reference signal; sub-sampling, by a sub-sampling PLL (SS-PLL) connected to the PLL, the reference signal; and causing, by a first pre-charge circuit connected to the SS-PLL, an output voltage of the SS-PLL to transition to an operating voltage to indicate that a difference between two voltage inputs is zero on average.

According to one embodiment, a method includes generating, by a PLL, a reference signal; sub-sampling, by an SS-PLL connected to the PLL, the reference signal; causing, by a first pre-charge circuit connected to the SS-PLL, an output voltage of the SS-PLL to transition to an operating voltage to indicate that a difference between two voltage inputs is zero on average; locking, by an FLL connected to the SS-PLL, a frequency of the SS-PLL; switching, by a switch connected between the FLL and an output of the SS-PLL, the output of the SS-PLL to the FLL; and coarse tuning, by a coarse tuner connected between the output of the SS-PLL and an input of the SS-PLL, the SS-PLL.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
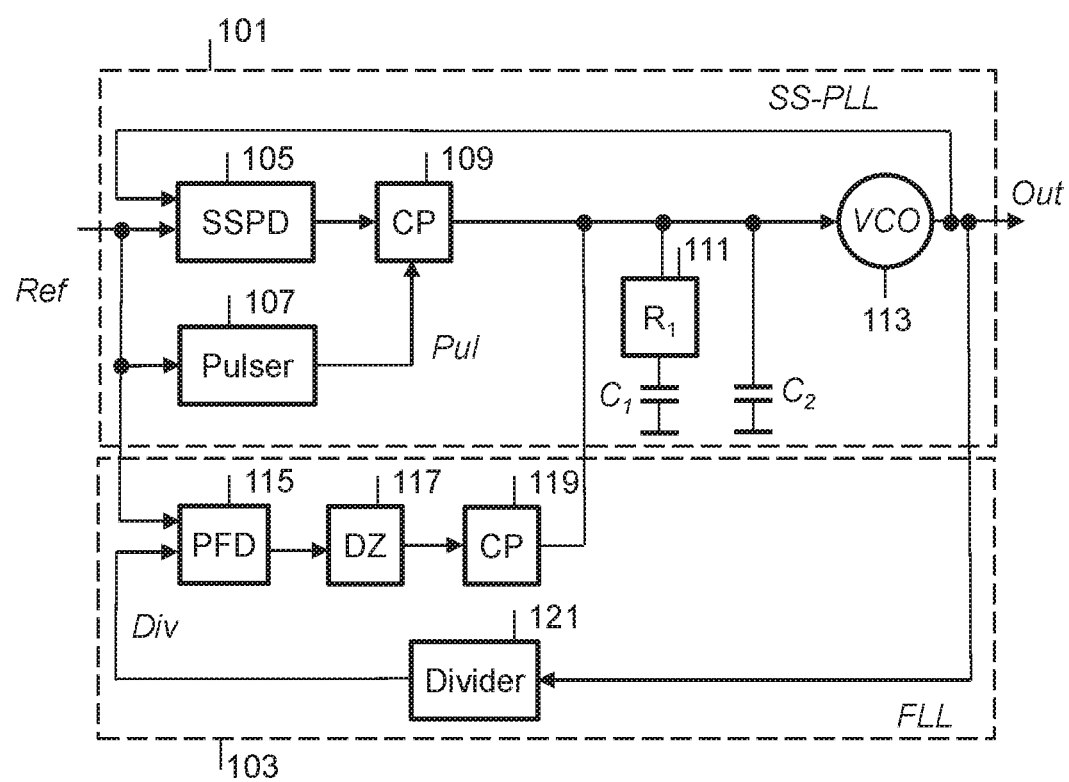
FIG. 1 illustrates a block diagram of an SS-PLL and an FLL, according to one embodiment.

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist with the overall understanding of the embodiments of the present disclosure. Therefore, it should be apparent to those skilled in the art that various changes and modifications of the embodiments described herein may be made without departing from the scope of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout this specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of the addition of one or more other features, numerals, steps, operations, structural elements, parts, or combinations thereof.

Unless defined differently, all terms used herein have the same meanings as those understood by a person skilled in the art to which the present disclosure belongs. Terms such as those defined in a generally used dictionary are to be interpreted to have the same meanings as the contextual meanings in the relevant field of art, and are not to be interpreted to have ideal or excessively formal meanings unless clearly defined in the present disclosure.

FIG. 1 illustrates a block diagram of an SS-PLL 101 and an FLL 103, according to one embodiment.

Referring to FIG. 1, the SS-PLL 101 includes an SSPD 105, a pulse generator or pulser 107, a charge pump (CP) 109, a resistor R1 111, a first capacitor C1, a second capacitor C2, and a VCO 113. The resistor R1 111, the first capacitor C1, and the second capacitor C2 form a low pass filter. However, the present disclosure is not limited to this type of low-pass filter, and any other type of low-pass filter may be implemented without deviating from the scope of the present disclosure. The FLL 103 includes a phase frequency detector (PFD) 115, a dead zone compensator (DZ) 117, a charge pump (CP) 119, and a divider 121.

The SSPD 105 includes a first input for receiving a reference signal, a second input from VCO 113 output and an output. The pulser 107 includes an input for receiving the reference signal and an output. The CP 109 of the SS-PLL 101 includes a first input connected to the output of the SSPD 105, a second input connected to the output of the pulser 107, and an output. The resistor R1 is connected between the output of the CP 109 of the SS-PLL 101 and the first capacitor C1. The first capacitor C1 is connected between the resistor R1 and ground. The second capacitor C2 is connected between the output of the CP 109 of the SS-PLL 101 and ground potential. The VCO 113 includes an input connected to the output of the CP 109 of the SS-PLL 101 and an output connected to the second input of the SSPD 105.

The PFD 115 includes a first input for receiving the reference signal, a second input, and an output. The DZ 117 includes an input connected to the output of the PDF 115 and an output. The CP 119 in the FLL 103 includes an input connected to the output of the DZ 117 and an output connected to the input of the VCO 113. The divider 121 includes an input connected to the output of the VCO 113 and an output connected to the second input of the PDF 115.

The FLL 103 assists the VCO 113 in locking to a target frequency before switching to the SS-PLL 101. The FLL 103 brings the frequency of the VCO 113 sufficiently close to the target frequency to assist in frequency locking so that the SS-PLL 101 may then successfully take over.

Figure 2:
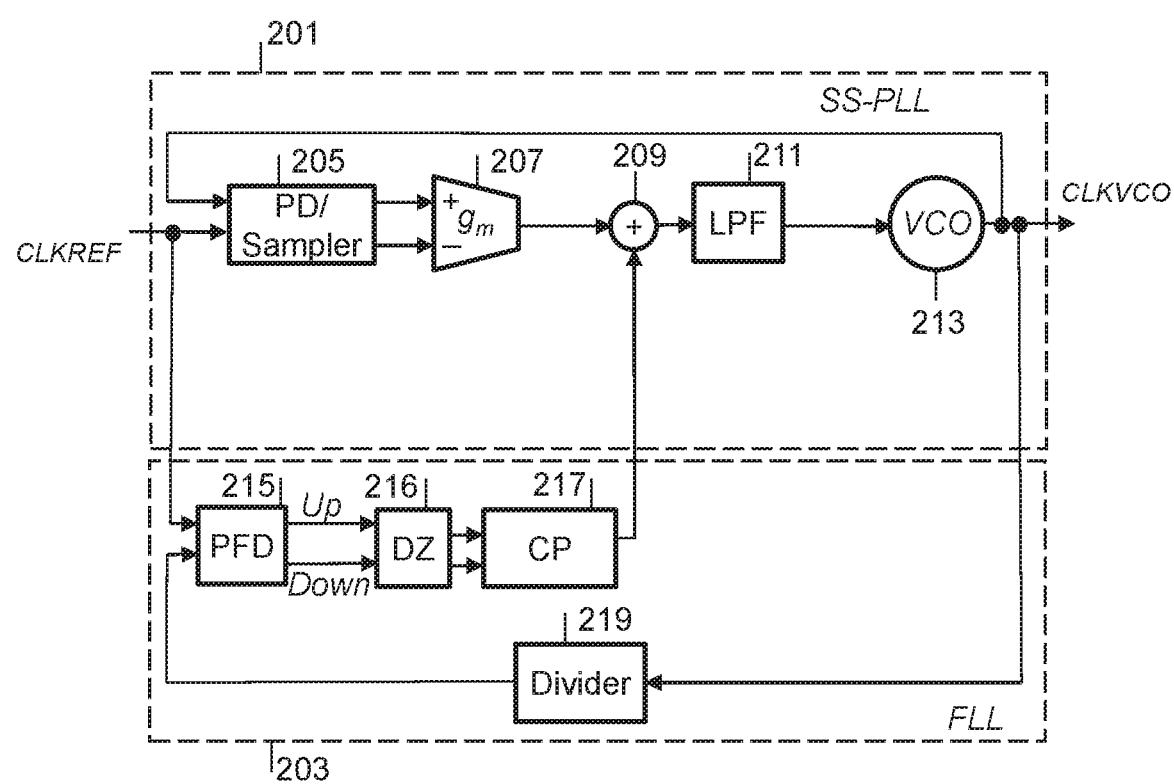
FIG. 2 illustrates another block diagram of an SS-PLL and an FLL, according to one embodiment.

FIG. 2 illustrates a block diagram of an SS-PLL 201 and an FLL 203, according to one embodiment.

Referring to FIG. 2, the SS-PLL 201 includes a pulse detector (PD)/sampler 205, a $g_m$ stage device 207, a summing node 209 (e.g., an added, a multiplexer, etc.) (where the current outputs from the $g_m$ stage device 207 and a CP 217 are connected together, and only one of those two outputs is enabled), a low pass filter (LPF) 211, and a VCO 213. The FLL 203 includes a PDF 215, a DZ 216, the CP 217, and a divider 219.

The PD/sampler 205 includes a first input for receiving a reference clock signal (CLKREF), a second input, a differential output. In an embodiment, the differential output of the PD/sampler 205 may be a single-ended output. The $g_m$ stage device 207 includes a positive input connected to the first output of the PD/sampler 205, a negative input connected to the second output of the PD/sampler 205, and an output. The summing node 209 includes a first input connected to the output of the $g_m$ stage device 207, a second input, and an output. The summing node 209 operates as a multiplexer. The multiplexer may be implemented explicitly or implicitly. When the FLL 203 locks, the FLL 203 enters a DZ and shuts off the output automatically, and then the output of the $g_m$ stage device 207 may be enabled by a switching control signal. The control may be generated from a lock detector, which is omitted from the drawing for simplicity. Otherwise, the switching signal may come from an external control signal to switch from the FLL 203 to the SS-PLL 201. The LPF 211 includes an input connected to the output of the summing node 209 and an output. The VCO 213 includes an input connected to the output of the LPF 211 and an output connected to the second input of the PD/sampler 205, where the output of the VCO 213 is a VCO clock signal (CLKVCO).

The PDF 215 includes a first input connected to the first input of the PD/sampler 205 for receiving CLKREF, a second input, a first (Up) output, and a second (Down) output. The DZ 216 includes a first input connected to the first output of the PDF 215, a second input connected to the second output of the PDF 215, a first output, and a second output. The CP 217 includes a first input connected to the first output of the DZ 216, a second input connected to the second output of the DZ 216, and an output connected to the second input of the summing node 209. The divider 219 includes an input connected to the output of the VCO 213 and an output connected to the second input of the PDF 215.

The SS-PLL 201 includes the FLL 203 or a digital counter to first obtain frequency locking before switching to the SS-PLL 201. The loop in the SS-PLL 201 and the loop in the FLL 203 may have different loop dynamics, requiring different LPFs. With a digital counter, a control voltage (e.g., VCTRL) is set to a constant voltage (e.g., a supply voltage (e.g., VDD) divided by 2 (e.g., VDD/2).

Figure 3:
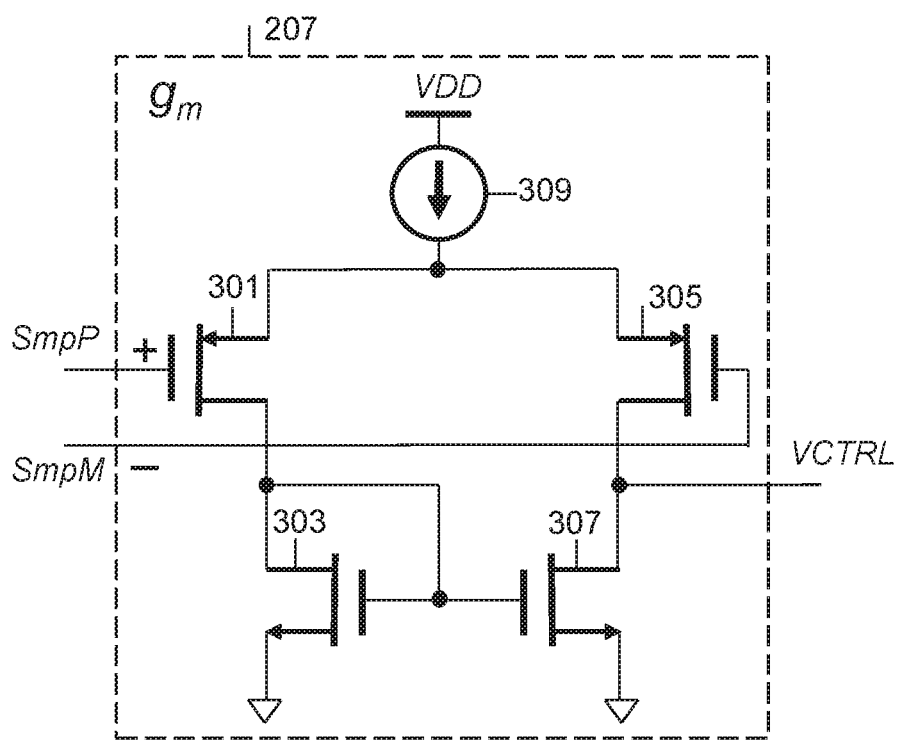
FIG. 3 illustrates a diagram of a $g_m$ stage device of an SS-PLL, according to one embodiment.

FIG. 3 illustrates a diagram of a $g_m$ stage device 207 of the SS-PLL 201, according to one embodiment.

Referring to FIG. 3, the $g_m$ stage device 207 includes a first p-channel metal oxide field-effect transistor (PMOSFET) 301, a first n-channel metal oxide field-effect transistor (NMOSFET) 303, a second PMOSFET transistor 305, a second NMOSFET 307, and a current source 309.

The first PMOSFET 301 includes a source, a gate for receiving a positive input SmpP, and a drain. The first NMOSFET 303 includes a drain connected to the drain of the first PMOSFET 301, a gate connected to the drain of the first PMOSFET 301, and a source connected to a ground potential. The second PMOSFET 305 includes a source, a gate for receiving a negative input SmpM, and a drain. The second NMOSFET 307 includes a drain connected to the drain of the second PMOSFET 305, a gate connected to the drain of the first PMOSFET 301, and a source connected to the ground potential, where the drain of the second NMOSFET 307 provides VCTRL. The current source 309 is connected between a power supply (e.g., VDD) and the sources of the first PMOSFET 301 and the second PMOSFET 305.

The inputs SmpP and SmpM are differential sampled outputs from an SS-PLL sampler (e.g., the SSPD in FIG. 1). The output VCTRL of the $g_m$ stage device 207 goes to an LPF and adjusts the frequency of a VCO.

When an SS-PLL is used in an application such as a $5^{th}$ generation (5G) mmWave application, the SS-PLL may operate at tens of GHz. A feedback divider for an FLL operating at a frequency as required by such a SS-PLL has high power consumption. To incorporate the FLL, the frequency accuracy requirement for the FLL may be as small as less than 1 mega-Hertz (MHz), depending on the specific PLL design parameters. A VCO of such a SS-PLL may require very fine resolution (e.g., least significant bit (LSB) resolution), which may introduce a large parasitic capacitance and, thus, is not preferred for mmWave applications, especially those requiring a wide frequency tuning range. Furthermore, during switching from an FLL to an SS-PLL, any disturbance or charge redistribution may shift a VCO frequency out of an acquisition range within which the SS-PLL can successfully lock.

Figure 4A:
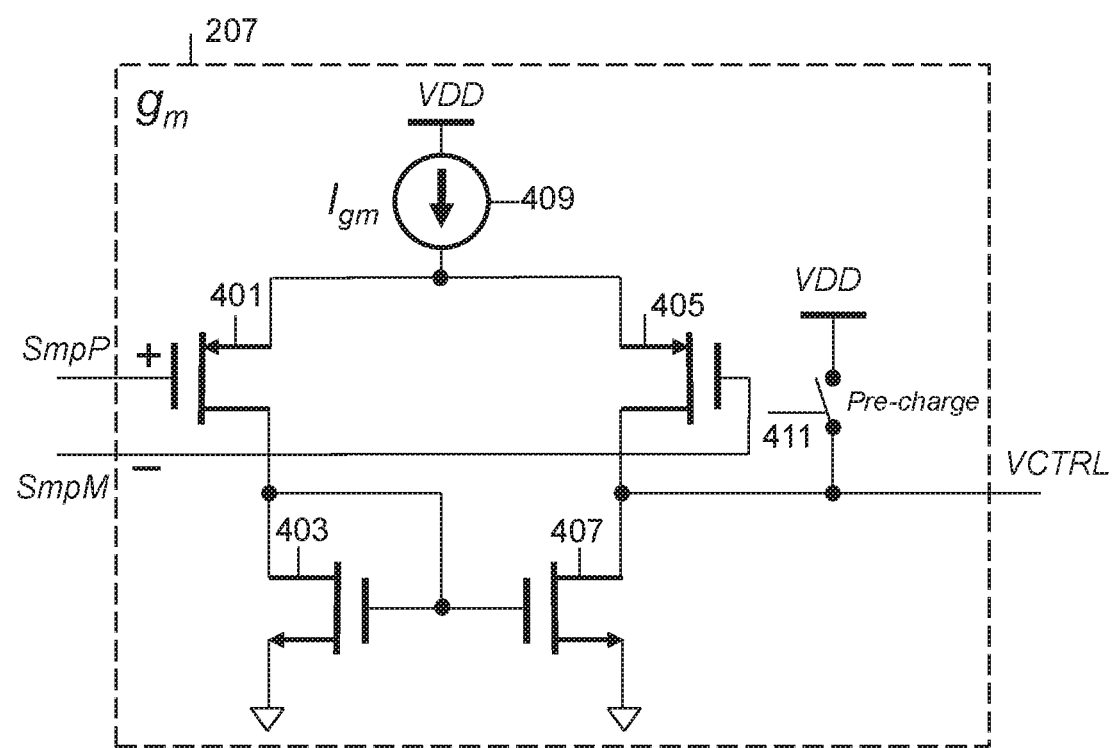
FIG. 4A illustrates a diagram of the present $g_m$ stage device with pre-charge, according to one embodiment.

FIG. 4A illustrates a diagram of a $g_m$ stage device 207 of the SS-PLL 201 with pre-charge, according to one embodiment.

Referring to FIG. 4A, the $g_m$ stage device 207 includes a first PMOSFET transistor 401, a first NMOSFET transistor 403, a second PMOSFET transistor 405, a second NMOSFET 407, a current source 409, and a switch 411.

The first PMOSFET 401 includes a source, a gate for receiving a positive input SmpP, and a drain. The first NMOSFET 403 includes a drain connected to the drain of the first PMOSFET 401, a gate connected to the drain of the first PMOSFET 401, and a source connected to a ground potential. The second PMOSFET 405 includes a source, a gate for receiving a negative input SmpM, and a drain. The second NMOSFET 407 includes a drain connected to the drain of the second PMOSFET 405, a gate connected to the drain of the first PMOSFET 401, and a source connected to the ground potential, where the drain of the second NMOSFET 407 provides VCTRL. The current source 409 is connected between a power supply (e.g., VDD) and the sources of the first PMOSFET 401 and the second PMOSFET 405. The switch 411 is connected between VDD and the drain of the second NMOSFET 407.

An SS-PLL may falsely lock to other frequencies, or might not recover from large frequency/phase errors. According to one embodiment, the $g_m$ stage device 207 of an SS-PLL includes an output node VCTRL (i.e., the drain of the second NMOSFET 407) having the switch 411 that pre-charges VCTRL to a desired voltage (e.g., VDD) when the switch 411 is closed, and then VCTRL is released by opening the switch 411. The voltage of VCTRL drops to the $g_m$ stage output operating point if the SS-PLL is not locked, since the differential inputs SmpP and SmpM to the $g_m$ stage are sine waves, where SmpP is the inverse of SmpM, and, thus, has a value of zero volts on average. The frequency $f_{SMP}$ of each of the sine waves is a difference between a reference frequency and a VCO frequency divided by a harmonic N (e.g., $f_{SMP}=f_{REF}-f_{VCO}/N$). When there is a zero volt input at the $g_m$ stage input, the output node drop due to leakage current until the output node reaches its operating point, which may be a value close to the ground potential by design.

When the SS-PLL is unlocked and the VCO frequency is out of the narrow locking range of the SS-PLL, the SS-PLL phase detector or sampler generates a zero volt differential output voltage on average, which feeds the inputs of the $g_m$ stage. The output VCTRL of the $g_m$ stage falls from VDD (e.g., 1V) to its operating point (e.g., 0.2V) when there is no required voltage at the input of the $g_m$ stage.

The harmonic N is determined by which harmonic is available in the VCO frequency range. Thus, there may be multiple solutions for N. When the SS-PLL loop is not locked, the average voltage arriving at the input of the $g_m$ stage will be equal to the middle of the sine wave swing (Vmid) for both SmpP and SmpM. Thus, the effective differential input to the $g_m$ stage is zero volts, and its output VCTRL settles to its operating point, which is selected to be a low voltage by design. For example, if VDD is 0.8V, and the $g_m$ stage output operating point is 0.2V, the $g_m$ stage output voltage VCTRL falls continuously from 0.8V to 0.2V.

If the VCTRL voltage for SS-PLL locking is within 0.2V to 0.8V, for example, VCTRL=0.5V, the SS-PLL automatically locks at VCTRL=0.5V when it falls from 0.8V to 0.5V, but does not continues to drop because the $g_m$ stage differential input voltage is not zero volts anymore when the SS-PLL is locked. There is a fixed voltage difference between SmpP and SmpM. The input voltage difference maintains the $g_m$ stage output voltage at the desired voltage value. VCTRL adjusts the frequency of a VCO. When VCTRL drops, the frequency of the VCO is swept from a high frequency $F_H$ to a low frequency $F_L$. If the target frequency is within the low frequency $F_L$ and the high frequency $F_H$, VCTRL stays at the value which corresponds to the target frequency. At that moment, the SS-PLL phase detector or sampler generates a required direct current (DC) voltage for $g_m$ stage input Smp_P/Smp_M to support VCTRL maintaining that value. The SS-PLL locks automatically. The sampler outputs or the $g_m$ stage inputs become two fixed voltages when the SS-PLL is locked. The $g_m$ stage inputs drive the $g_m$ stage output VCTRL voltage to a certain value which adjusts the VCO to oscillate at a desired frequency.

According to one embodiment, since there is only one desired harmonic of input reference frequency when VCTRL drops from 0.8V to 0.2V, so that the SS-PLL does not lock to a wrong harmonic, the present apparatus and method may include one of (1) a high reference frequency (e.g., 6 GHz) and a VCO having a tuning range less than a reference frequency (e.g., from 16 GHz to 20 GHz), so that there is only one harmonic solution for the VCO tuning range (e.g., 3× harmonic in this case) and/or (2) VCO coarse tuning to divide a whole VCO tuning range into several sub-ranges, until there is only one harmonic in each sub-range. Coarse tuning may be implemented by digital-counter searching or an FLL loop.

Compared to conventionally adding an FLL/digital counter for frequency locking, the present apparatus and method is more robust without requiring a VCO with very fine resolution or tight VCO frequency accuracy before switching to an SS-PLL, and more resistant to frequency transient/disturbance or charge redistribution before switching to the SS-PLL.

Figure 4B:
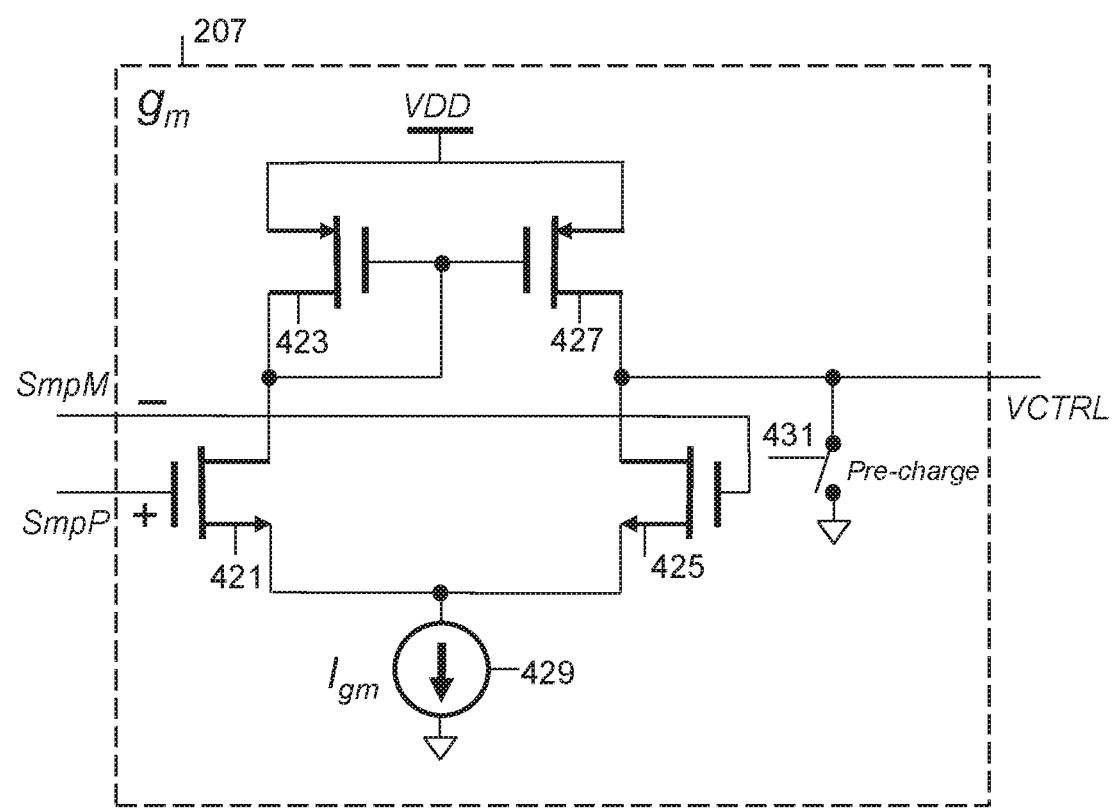
FIG. 4B illustrates another diagram of the present $g_m$ stage device with pre-charge, according to one embodiment.

FIG. 4B illustrates another diagram of a $g_m$ stage device 207 of the SS-PLL 201 with pre-charge, according to one embodiment.

Referring to FIG. 4B, the $g_m$ stage device 207 includes a first NMOSFET transistor 421, a first PMOSFET transistor 423, a second NMOSFET transistor 425, a second PMOSFET 427, a current source 429, and a switch 431.

The first NMOSFET 421 includes a source, a gate for receiving a positive input SmpP, and a drain. The first PMOSFET 423 includes a drain connected to the drain of the first NMOSFET 421, a gate connected to the drain of the first NMOSFET 421, and a source connected to a power supply (e.g., VDD). The second NMOSFET 425 includes a source, a gate for receiving a negative input SmpM, and a drain. The second PMOSFET 427 includes a drain connected to the drain of the second NMOSFET 425, a gate connected to the drain of the first NMOSFET 421, and a source connected to the power supply (e.g., VDD), where the drain of the second PMOSFET 427 provides VCTRL. The current source 429 is connected between a ground potential and the sources of the first NMOSFET 421 and the second NMOSFET 425. The switch 431 is connected between the ground potential and the drain of the second PMOSFET 427.

Figure 5:
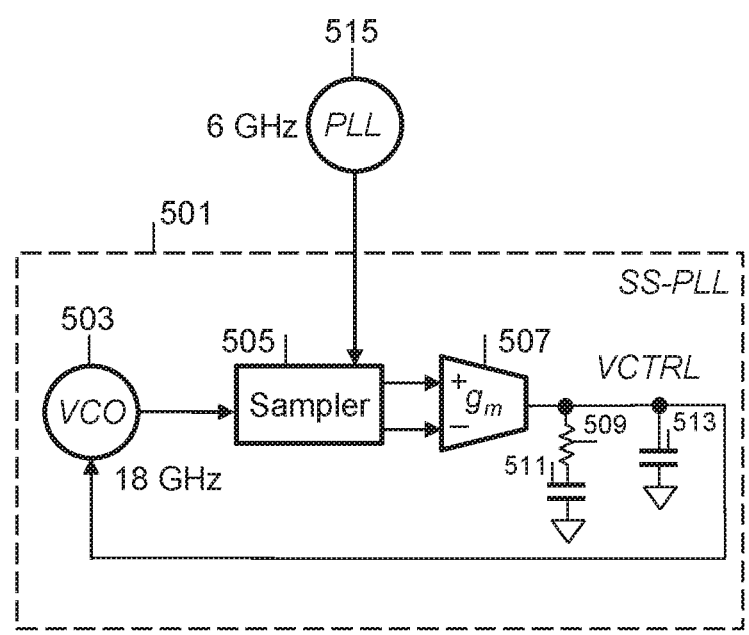
FIG. 5 illustrates a block diagram of an SS-PLL, according to one embodiment.

FIG. 5 illustrates a block diagram of an SS-PLL 501, according to one embodiment.

Referring to FIG. 5, the SS-PLL 501 includes a VCO 503, a sampler 505, a $g_m$ stage device 507, a resistor 509, a first capacitor 511, and a second capacitor 513. The resistor 509, the first capacitor 511, and the second capacitor 513 form a low pass filter. However, the present disclosure is not limited to this type of low-pass filter, and any other type of low-pass filter may be implemented without deviating from the scope of the present disclosure. A PLL 515 is connected to the SS-PLL 501.

The VCO 503 includes an input and an output. The sampler 505 includes a first input connected to the output of the VCO 503, a second input, a first output, and a second output. The $g_m$ stage device 507 includes a positive input connected to the first output of the sampler 505, a negative input connected to the second output of the sampler 505, and an output VCTRL connected to the input of the VCO 503. The resistor 509 is connected between the output of the $g_m$ stage device 507 and the first capacitor 511. The first capacitor 511 is connected between the resistor 509 and a ground potential. The second capacitor 513 is connected between the output of the $g_m$ stage device 507 and the ground potential. The PLL 515 has an output connected to the second input of the sampler 505.

For example, the VCO 503 generates an 18 GHz local oscillator (LO) frequency for a 5G mmWave transceiver. The tuning range of the VCO 503 is less than 6 GHz, which is less than its input reference frequency from a PLL. Thus, the SS-PLL 501 can only lock to 3x of an input clock, and the tuning range of the VCO 503 ensures there is only one harmonic to which the SS-PLL 501 can lock. The SS-PLL 501 receives a 6 GHz input from the PLL 515 and generates an 18 GHz output.

Even without the need to select a target frequency (e.g., 3× harmonic) from multiple harmonics of an input reference frequency, the SS-PLL 501 may not lock for most cases due to its very limited acquisition range. Typically, VCTRL should be within 50 mV or less of the final value before the SS-PLL 501 can lock, which depends on the specific design. Out of that range, the SS-PLL 501 samples an effective average value of zero volts and the loop still cannot lock.

Figure 6:
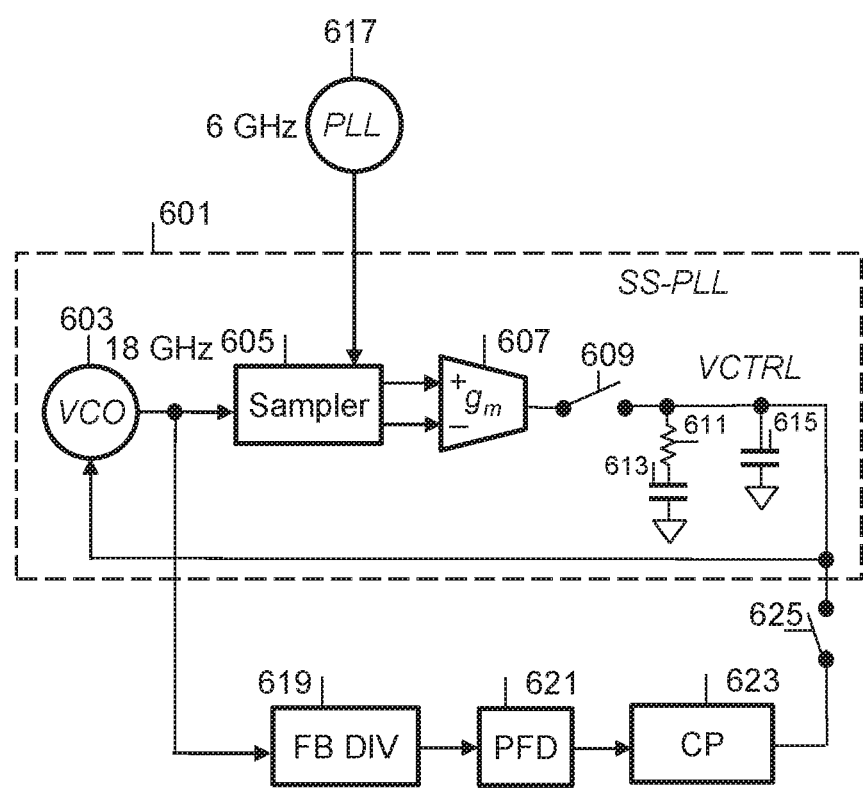
FIG. 6 illustrates another block diagram of an SS-PLL and an FLL, according to one embodiment.

FIG. 6 illustrates another block diagram of an SS-PLL 601 and an FLL, according to one embodiment.

Referring to FIG. 6, the SS-PLL 601 includes a VCO 603, a sampler 605, a $g_m$ stage device 607, a first switch 609, a resistor 611, a first capacitor 613, and a second capacitor 615. The resistor 609, the first capacitor 613, and the second capacitor 615 form a low pass filter. However, the present disclosure is not limited to this type of low-pass filter, and any other type of low-pass filter may be implemented without deviating from the scope of the present disclosure. A PLL 617, a feedback divider (FB DIV) 619, a PFD 621, a CP 623, and a second switch 625 are connected to the SS-PLL 601.

The VCO 603 includes an input and an output. The sampler 605 includes a first input connected to the output of the VCO 603, a second input, a first output, and a second output. The $g_m$ stage device 607 includes a positive input connected to the first output of the sampler 605, a negative input connected to the second output of the sampler 605, and an output. The first switch 609 is connected between the output of the $g_m$ stage device 607 and the input of the VCO 603, where VCTRL is generated where the first switch 609 is connected to the VCO 603. The resistor 611 is connected between the input of the VCO 603 and the first capacitor 613. The first capacitor 613 is connected between the resistor 611 and a ground potential. The second capacitor 615 is connected between the input of the VCO 603 and the ground potential. The PLL 617 has an output connected to the second input of the sampler 605.

The FB DIV 619 includes an input connected to the output of the VCO 603 and an output. The PDF 621 includes an input connected to the output of the FB DIV 619 and an output. The CP 623 includes an input connected to the output of the PDF 621 and an output. The second switch 625 is connected between the output of the CP 623 and the input to the VCO 603, where the second switch 625 may be an explicit switch or an implicit switch implemented by a DZ in a PFD.

The FB DIV 619, the PFD 621, the CP 623, and the second switch 625 is the FLL, which facilitates frequency locking. The first switch 609 and the second switch 625 are used to switch between the FLL and the SS-PLL 601. The FBDIV or digital-counter must work at higher than 18 GHz, which is challenging to design and typically results in high power consumption.

Figure 7A:
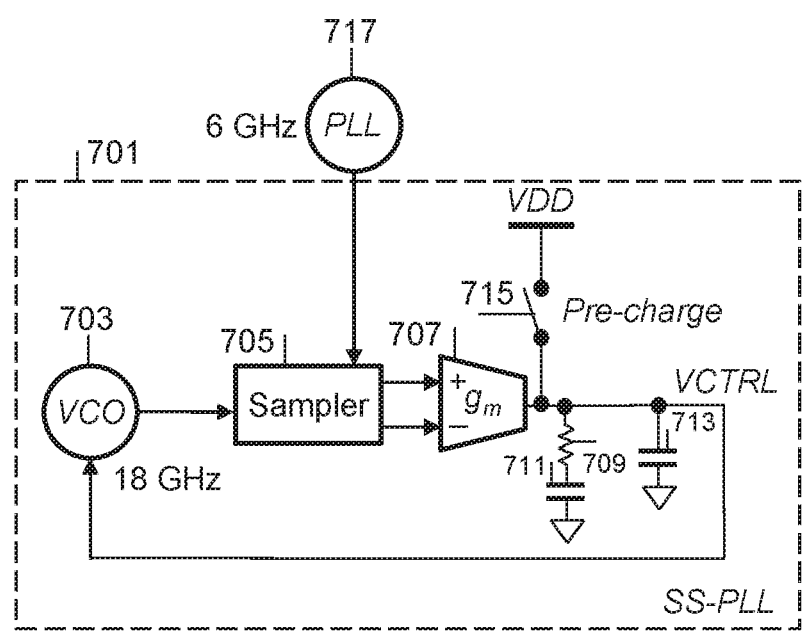
FIG. 7A illustrates a block diagram of the present SS-PLL with pre-charge, according to one embodiment.

FIG. 7A illustrates a block diagram of an SS-PLL 701 with pre-charge, according to one embodiment.

Referring to FIG. 7A, the SS-PLL 701 includes a VCO 703, a sampler 705, a $g_m$ stage device 707, a resistor 709, a first capacitor 711, a second capacitor 713, and a switch 715. A PLL 717 is connected to the SS-PLL 701. The resistor 709, the first capacitor 711, and the second capacitor 713 form a low pass filter. However, the present disclosure is not limited to this type of low-pass filter, and any other type of low-pass filter may be implemented without deviating from the scope of the present disclosure.

The VCO 703 includes an input and an output. The sampler 705 includes a first input connected to the output of the VCO 703, a second input, a first output, and a second output. The $g_m$ stage device 707 includes a positive input connected to the first output of the sampler 705, a negative input connected to the second output of the sampler 705, and an output VCTRL connected to the input of the VCO 703. The resistor 709 is connected between the output of the $g_m$ stage device 707 and the first capacitor 711. The first capacitor 711 is connected between the resistor 709 and a ground potential. The second capacitor 713 is connected between the output of the $g_m$ stage device 707 and the ground potential. The switch 715 is connected between the output of the $g_m$ stage device 707 and a power supply (e.g., VDD). The PLL 717 has an output connected to the second input of the sampler 705.

Initially, the switch 715 is closed and VCTRL is pre-charged to VDD. Then, the switch 715 is opened, and VCTRL drops and stops at a value which makes SS-PLL lock.

When the VCO 703 has a large tuning range which contains multiple harmonics of an input reference frequency, or a smaller gain $K_{VCO}$ of the VCO 703 is desired to more easily keep the loop stable.

Figure 7B:
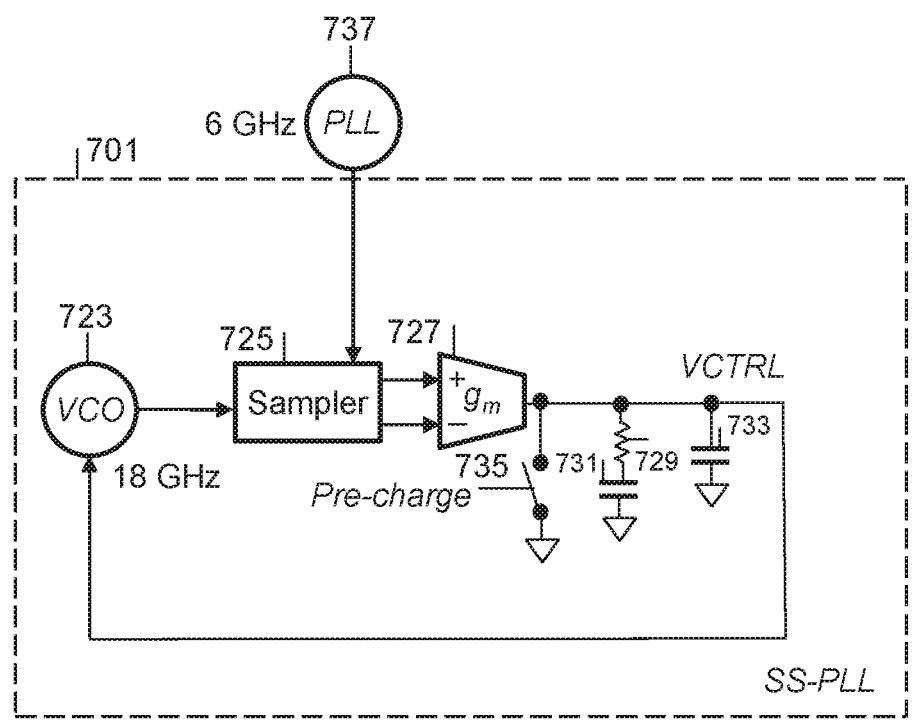
FIG. 7B illustrates another block diagram of the present SS-PLL with pre-charge, according to one embodiment.

FIG. 7B illustrates another block diagram of an SS-PLL 701 with pre-charge, according to one embodiment.

Referring to FIG. 7B, the SS-PLL 701 includes a VCO 723, a sampler 725, a $g_m$ stage device 727, a resistor 729, a first capacitor 731, a second capacitor 733, and a switch 735. A PLL 737 is connected to the SS-PLL 701. The resistor 729, the first capacitor 731, and the second capacitor 733 form a low pass filter. However, the present disclosure is not limited to this type of low-pass filter, and any other type of low-pass filter may be implemented without deviating from the scope of the present disclosure.

The VCO 723 includes an input and an output. The sampler 725 includes a first input connected to the output of the VCO 723, a second input, a first output, and a second output. The $g_m$ stage device 727 includes a positive input connected to the first output of the sampler 725, a negative input connected to the second output of the sampler 725, and an output VCTRL connected to the input of the VCO 723. The resistor 729 is connected between the output of the $g_m$ stage device 727 and the first capacitor 731. The first capacitor 731 is connected between the resistor 729 and a ground potential. The second capacitor 733 is connected between the output of the $g_m$ stage device 727 and the ground potential. The switch 735 is connected between the output of the $g_m$ stage device 727 and the ground potential. The PLL 737 has an output connected to the second input of the sampler 725.

Initially, the switch 735 is closed and VCTRL is pre-charged to the ground potential. Then, the switch 735 is opened, and VCTRL rises and stops at a value which makes SS-PLL lock.

When the VCO 723 has a large tuning range which contains multiple harmonics of an input reference frequency, or a smaller gain $K_{VCO}$ of the VCO 723 is desired to more easily keep the loop stable.

Figure 8A:
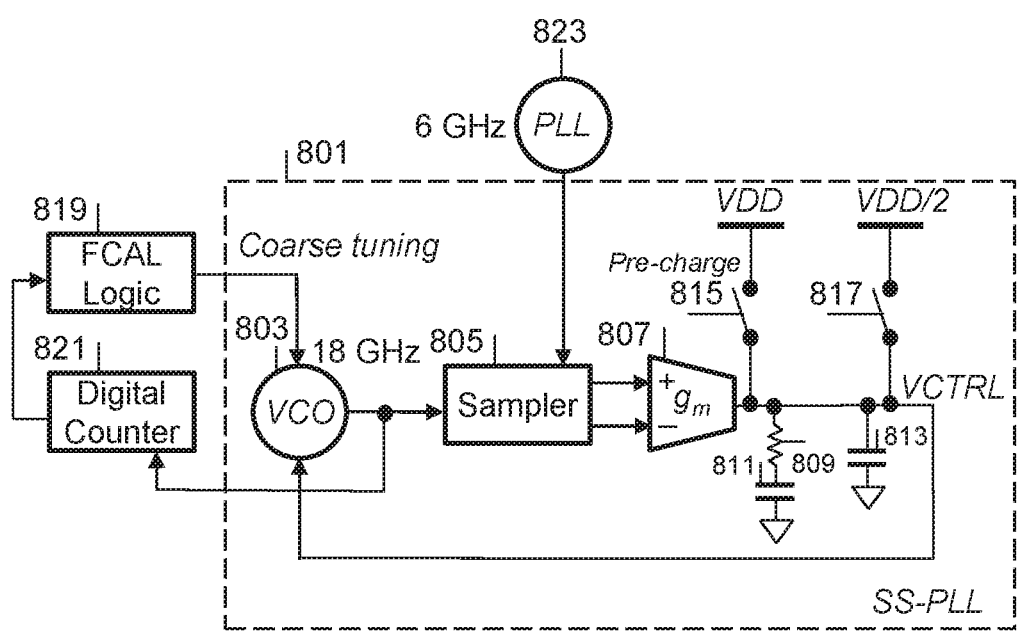
FIG. 8A illustrates a block diagram of the present SS-PLL with coarse tuning, according to one embodiment.

FIG. 8A illustrates a block diagram of an SS-PLL 801 with coarse tuning, according to one embodiment.

Referring to FIG. 8A, the SS-PLL 801 includes a VCO 803, a sampler 805, a $g_m$ stage device 807, a resistor 809, a first capacitor 811, a second capacitor 813, a first switch 815, and a second switch 817. The resistor 809, the first capacitor 811, and the second capacitor 813 form a low pass filter. However, the present disclosure is not limited to this type of low-pass filter, and any other type of low-pass filter may be implemented without deviating from the scope of the present disclosure. A frequency calculation logic (FCAL) device 819, a digital counter 821, and a PLL 823 are connected to the SS-PLL 801.

The VCO 803 includes a first input, a second input, and an output. The sampler 805 includes a first input connected to the output of the VCO 803, a second input, a first output, and a second output. The $g_m$ stage device 807 includes a positive input connected to the first output of the sampler 805, a negative input connected to the second output of the sampler 805, and an output VCTRL connected to the first input of the VCO 803. The resistor 809 is connected between the output of the $g_m$ stage device 807 and the first capacitor 811. The first capacitor 811 is connected between the resistor 809 and a ground potential. The second capacitor 813 is connected between the output of the $g_m$ stage device 807 and the ground potential. The first switch 815 is connected between the output of the $g_m$ stage device 807 and a power supply (e.g., VDD). The second switch 817 is connected between the output of the $g_m$ stage device 807 and half of the power supply (e.g., VDD/2). During FCAL, the switch 817 is closed to set VCTRL to VDD/2. After FCAL is finished, the switch 817 is open. The FCAL logic device 819 includes an input and an output connected to the second input of the VCO 803. The digital counter 821 includes an input connected to the output of the VCO 803 and an output connected to the input of the FCAL logic device 819. The PLL 823 has an output connected to the second input of the sampler 805.

A coarse tuning scheme is added to first select a correct frequency sub-range of the VCO 803, and then perform an automatic search as described above. The coarse tuning is implemented by searching of the digital counter 821 and the FCAL logic device 819. The SS-PLL 801 includes the digital counter 821 and the FCAL logic device 819 for providing coarse tuning for the VCO 803. First, VCTRL is pre-charged to VDD/2 by closing the second switch 817. Then, coarse tuning is performed. After coarse tuning is completed, the second switch 817 is opened, and VCTRL is pre-charged to VDD by closing the first switch 815. Then, the first switch 815 is opened and VCTRL drops to a voltage for automatic locking.

Figure 8B:
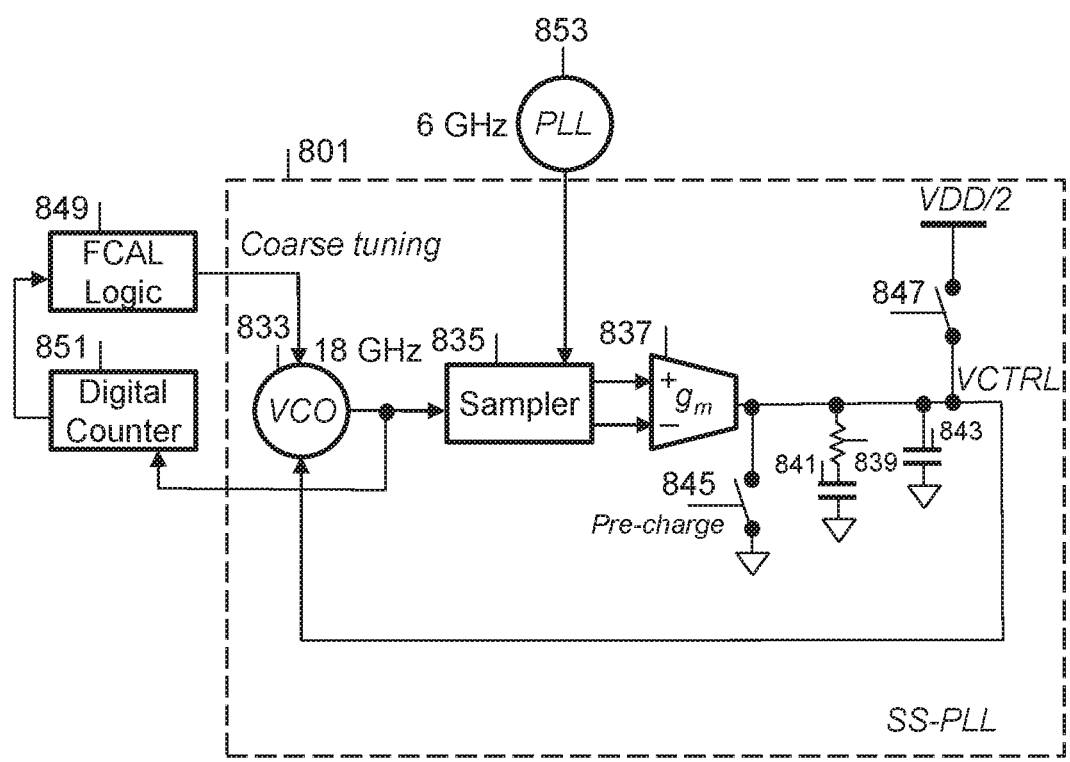
FIG. 8B illustrates another block diagram of the present SS-PLL with coarse tuning, according to one embodiment.

FIG. 8B illustrates another block diagram of an SS-PLL 801 with coarse tuning, according to one embodiment.

Referring to FIG. 8B, the SS-PLL 801 includes a VCO 833, a sampler 835, a $g_m$ stage device 837, a resistor 839, a first capacitor 841, a second capacitor 843, a first switch 845, and a second switch 847. The resistor 839, the first capacitor 841, and the second capacitor 843 form a low pass filter. However, the present disclosure is not limited to this type of low-pass filter, and any other type of low-pass filter may be implemented without deviating from the scope of the present disclosure. A frequency calculation logic (FCAL) device 849, a digital counter 851, and a PLL 853 are connected to the SS-PLL 801.

The VCO 833 includes a first input, a second input, and an output. The sampler 835 includes a first input connected to the output of the VCO 833, a second input, a first output, and a second output. The $g_m$ stage device 837 includes a positive input connected to the first output of the sampler 835, a negative input connected to the second output of the sampler 835, and an output VCTRL connected to the first input of the VCO 833. The resistor 839 is connected between the output of the $g_m$ stage device 837 and the first capacitor 841. The first capacitor 841 is connected between the resistor 839 and a ground potential. The second capacitor 843 is connected between the output of the $g_m$ stage device 837 and the ground potential. The first switch 845 is connected between the output of the $g_m$ stage device 837 and the ground potential. The second switch 847 is connected between the output of the $g_m$ stage device 837 and half of the power supply (e.g., VDD/2). During FCAL, the switch 847 is closed to set VCTRL to VDD/2. After FCAL is finished, the switch 847 is open. The FCAL logic device 849 includes an input and an output connected to the second input of the VCO 833. The digital counter 851 includes an input connected to the output of the VCO 833 and an output connected to the input of the FCAL logic device 849. The PLL 853 has an output connected to the second input of the sampler 835.

A coarse tuning scheme is added to first select a correct frequency sub-range of the VCO 833, and then perform an automatic search as described above. The coarse tuning is implemented by searching of the digital counter 851 and the FCAL logic device 849. The SS-PLL 801 includes the digital counter 851 and the FCAL logic device 849 for providing coarse tuning for the VCO 833. First, VCTRL is pre-charged to VDD/2 by closing the second switch 847. Then, coarse tuning is performed. After coarse tuning is completed, the second switch 847 is opened, and VCTRL is pre-charged to the ground potential by closing the first switch 845. Then, the first switch 845 is opened and VCTRL rises to a voltage for automatic locking.

Figure 9A:
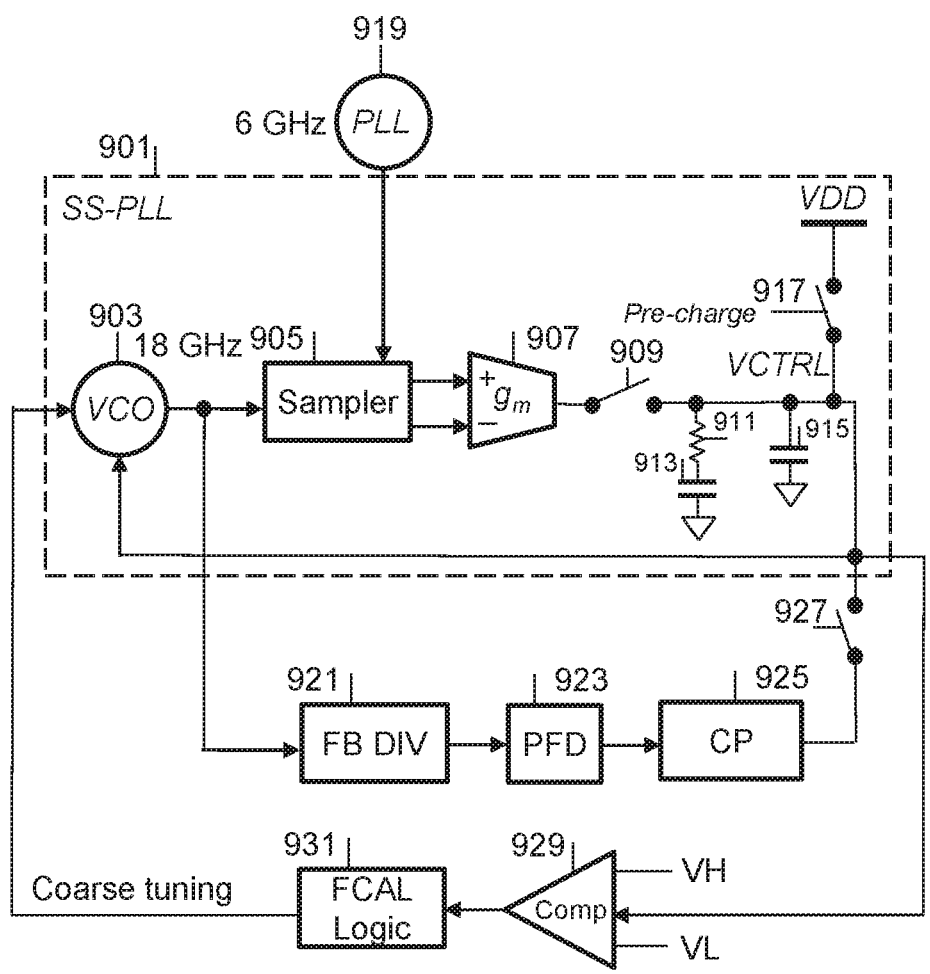
FIG. 9A illustrates a block diagram of the present SS-PLL with an FLL and coarse tuning, according to one embodiment.

FIG. 9A illustrates a block diagram of an SS-PLL 901 and an FLL with coarse tuning, according to one embodiment.

Referring to FIG. 9A, the SS-PLL 901 includes a VCO 903, a sampler 905, a $g_m$ stage device 907, a first switch 909, a resistor 911, a first capacitor 913, a second capacitor 915, and a second switch 917. The resistor 911, the first capacitor 913, and the second capacitor 915 form a low pass filter. However, the present disclosure is not limited to this type of low-pass filter, and any other type of low-pass filter may be implemented without deviating from the scope of the present disclosure. A PLL 919, an FB DIV 921, a PFD 923, a CP 925, a second switch 927, a comparator (Comp) 929, and an FCAL logic device 931 are connected to the SS-PLL 901.

The VCO 903 includes a first input, a second input, and an output. The sampler 905 includes a first input connected to the output of the VCO 903, a second input, a first output, and a second output. The $g_m$ stage device 907 includes a positive input connected to the first output of the sampler 905, a negative input connected to the second output of the sampler 905, and an output. The first switch 909 is connected between the output of the $g_m$ stage device 907 and the first input of the VCO 903, where VCTRL is generated where the first switch 909 is connected to the VCO 903. The resistor 911 is connected between the first input of the VCO 903 and the first capacitor 913. The first capacitor 913 is connected between the resistor 911 and a ground potential. The second capacitor 915 is connected between the first input of the VCO 903 and the ground potential. The second switch 917 is connected between a power supply voltage (e.g., VDD) and the first input of the VCO 903. The PLL 919 has an output connected to the second input of the sampler 905.

The FB DIV 921 includes an input connected to the output of the VCO 903 and an output. The PDF 923 includes an input connected to the output of the FB DIV 921 and an output. The CP 925 includes an input connected to the output of the PDF 923 and an output. The second switch 627 is connected between the output of the CP 925 and the first input to the VCO 903. The comparator 929 includes a first input for receiving a high voltage threshold VH, a second input for receiving a low voltage threshold VL, a third input connected to the first input of the VCO 903, and an output. The FCAL logic device 931 includes an input connected to the output of the comparator 929 and an output connected to the second input of the VCO 903.

Coarse tuning is implemented in the FLL loop by the comparator 929 and the FCAL logic device 931. After coarse tuning is completed, VCTRL is pre-charged to VDD to perform automatic searching for SS-PLL lock acquisition.

Figure 9B:
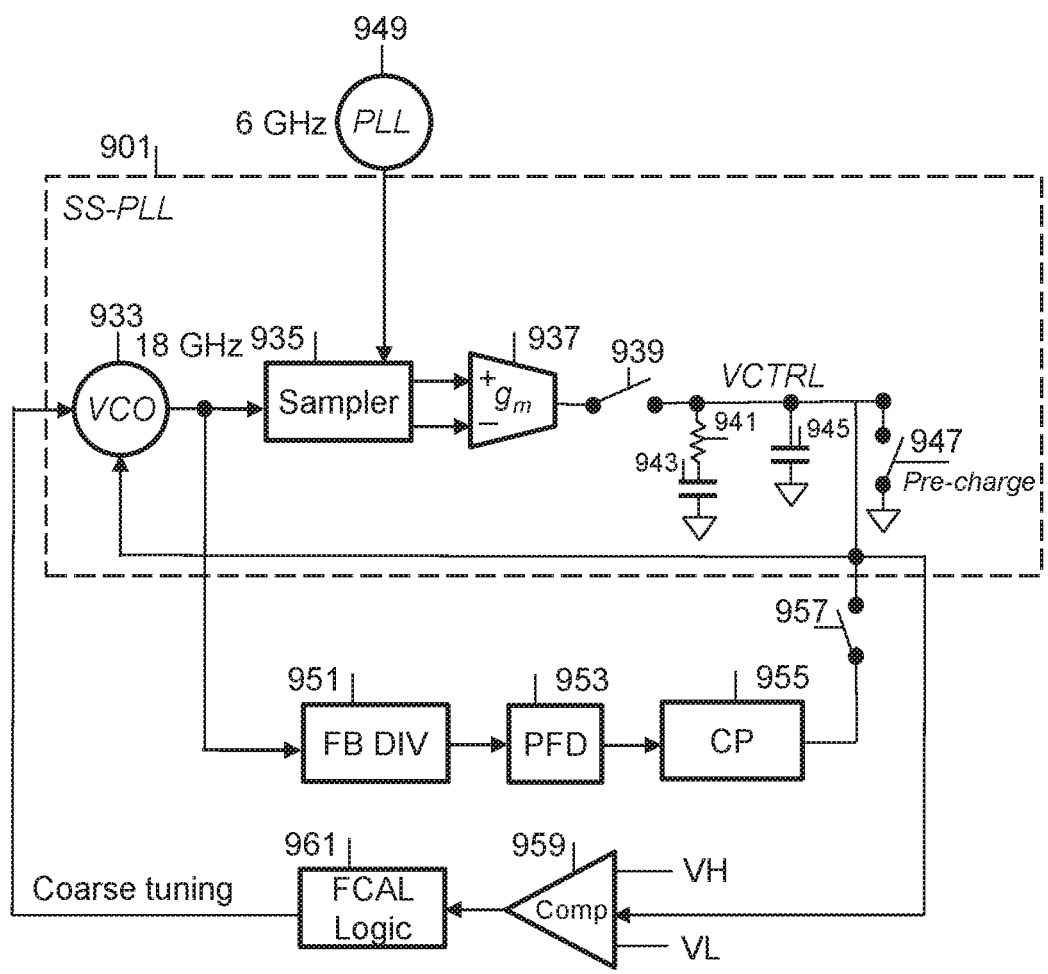
FIG. 9B illustrates another block diagram of the present SS-PLL with an FLL and coarse tuning, according to one embodiment.

FIG. 9B illustrates another block diagram of an SS-PLL 901 and an FLL with coarse tuning, according to one embodiment.

Referring to FIG. 9B, the SS-PLL 901 includes a VCO 933, a sampler 935, a $g_m$ stage device 937, a first switch 939, a resistor 941, a first capacitor 943, a second capacitor 945, and a second switch 947. The resistor 941, the first capacitor 943, and the second capacitor 945 form a low pass filter. However, the present disclosure is not limited to this type of low-pass filter, and any other type of low-pass filter may be implemented without deviating from the scope of the present disclosure. A PLL 949, an FB DIV 951, a PFD 953, a CP 955, a second switch 957, a Comp 959, and an FCAL logic device 961 are connected to the SS-PLL 901.

The VCO 933 includes a first input, a second input, and an output. The sampler 935 includes a first input connected to the output of the VCO 933, a second input, a first output, and a second output. The $g_m$ stage device 937 includes a positive input connected to the first output of the sampler 935, a negative input connected to the second output of the sampler 935, and an output. The first switch 939 is connected between the output of the $g_m$ stage device 937 and the first input of the VCO 933, where VCTRL is generated where the first switch 939 is connected to the VCO 933. The resistor 941 is connected between the first input of the VCO 933 and the first capacitor 943. The first capacitor 943 is connected between the resistor 941 and a ground potential. The second capacitor 945 is connected between the first input of the VCO 933 and the ground potential. The second switch 947 is connected between a ground potential and the first input of the VCO 933. The PLL 949 has an output connected to the second input of the sampler 935.

The FB DIV 951 includes an input connected to the output of the VCO 933 and an output. The PDF 953 includes an input connected to the output of the FB DIV 951 and an output. The CP 955 includes an input connected to the output of the PDF 953 and an output. The second switch 657 is connected between the output of the CP 955 and the first input to the VCO 933. The comparator 959 includes a first input for receiving a high voltage threshold VH, a second input for receiving a low voltage threshold VL, a third input connected to the first input of the VCO 933, and an output. The FCAL logic device 961 includes an input connected to the output of the comparator 959 and an output connected to the second input of the VCO 933.

Coarse tuning is implemented in the FLL loop by the comparator 959 and the FCAL logic device 961. After coarse tuning is completed, VCTRL is pre-charged to the ground potential to perform automatic searching for SS-PLL lock acquisition.

Either a digital-counter based search or an FLL loop may work independently to finish frequency acquisition before switching to an SS-PLL. The benefits of adding automatic search are (1) a requirement on how close the frequency locking must be to the final frequency is relaxed and (2) a higher resistance to switching transient/disturbance from digital-counter/FLL to SS-PLL and guaranteed SS-PLL locking as long as coarse tuning selects the correct harmonic frequency sub-range of the VCO. As long as there is only one harmonic of a reference frequency in the selected sub-range, the SS-PLL may lock with this method. This relaxes the VCO LSB design, which is challenging especially in the tens of GHz range for an mmWave application with a wide tuning range.

Figure 10A:
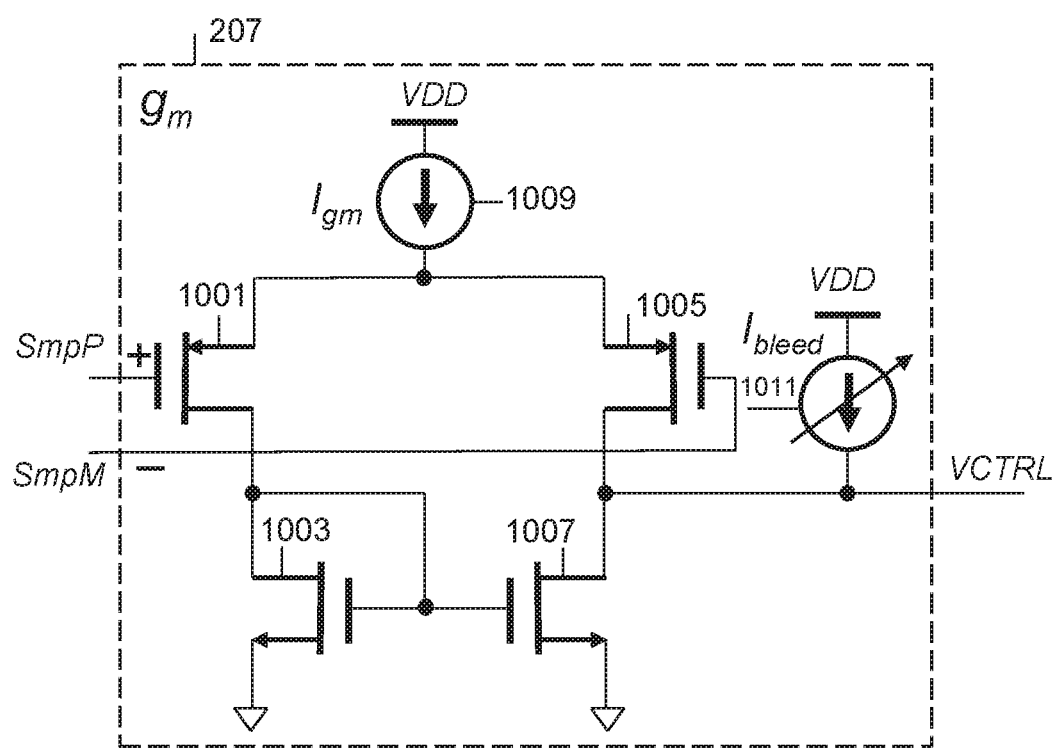
FIG. 10A illustrates a diagram of the present $g_m$ stage device of an SS-PLL with current bleeding, according to one embodiment.

FIG. 10A illustrates a diagram of a $g_m$ stage device 207 of an SS-PLL with current bleeding, according to one embodiment.

Referring to FIG. 10A, the $g_m$ stage device 207 includes a first PMOSFET transistor 1001, a first NMOSFET transistor 1003, a second PMOSFET transistor 1005, a second NMOSFET 1007, a current source 1009, and a bleeding current source 1011.

The first PMOSFET 1001 includes a source, a gate for receiving a positive input SmpP, and a drain. The first NMOSFET 1003 includes a drain connected to the drain of the first PMOSFET 1001, a gate connected to the drain of the first PMOSFET 1001, and a source connected to a ground potential. The second PMOSFET 1005 includes a source, a gate for receiving a negative input SmpM, and a drain. The second NMOSFET 1007 includes a drain connected to the drain of the second PMOSFET 1005, a gate connected to the drain of the first PMOSFET 1001, and a source connected to the ground potential, where the drain of the second NMOSFET 1007 provides VCTRL. The current source 1009 is connected between a power supply (e.g., VDD) and the sources of the first PMOSFET 1001 and the second PMOSFET 1005. The bleeding current source 1011 is connected between VDD and the drain of the second NMOSFET 1007.

The bleeding current source 1011 is an actual current source in addition to a pre-charge circuit. The bleeding current source 1011 sinks/sources additional current from an output node of the $g_m$ stage device 207 so that the $g_m$ stage device 207 must provide an equal amount of current in an opposite direction to achieve zero net output current for a PLL locking state. Thus, an input of the $g_m$ stage device 207 must bear an input voltage instead of a zero input to support the current, which is typically called an input offset voltage. By manually controlling the input offset voltage, an output operating point may be adjusted when there is a zero voltage at the input of the $g_m$ stage device 207. Thus, the output voltage range of the $g_m$ stage device 207 is expanded in which an SS-PLL locking state may be searched.

Figure 10B:
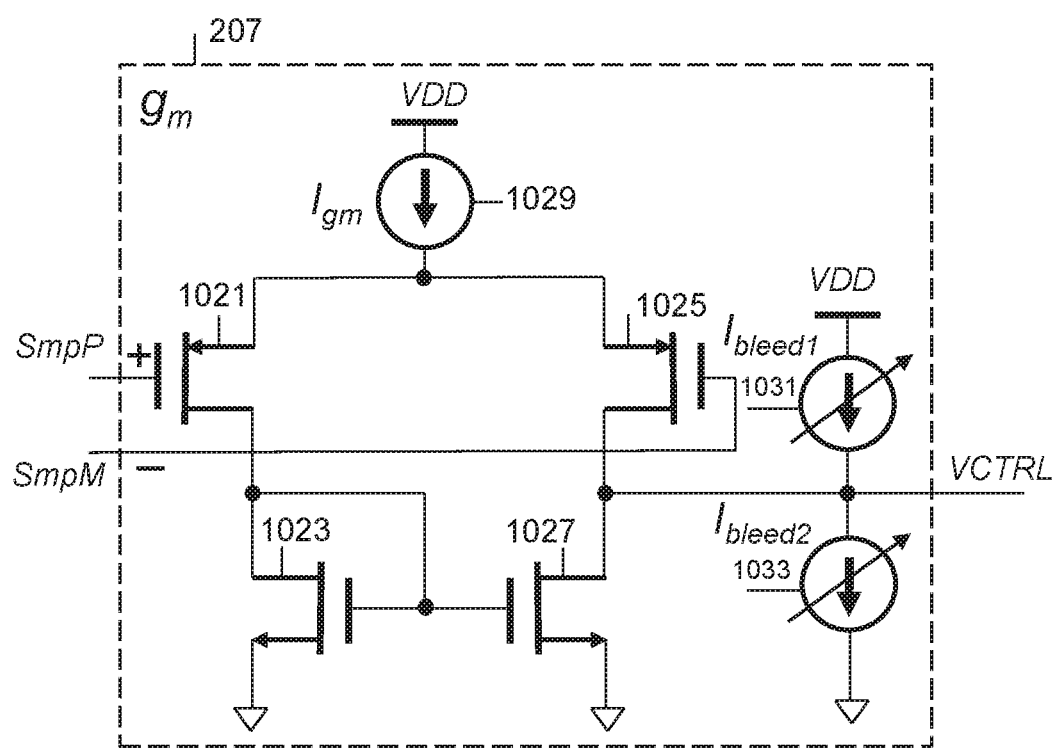
FIG. 10B illustrates another diagram of the present $g_m$ stage device of an SS-PLL with current bleeding, according to one embodiment.

FIG. 10B illustrates another diagram of a $g_m$ stage device 207 of an SS-PLL with current bleeding, according to one embodiment.

Referring to FIG. 10B, the $g_m$ stage device 207 includes a first PMOSFET transistor 1021, a first NMOSFET transistor 1023, a second PMOSFET transistor 1025, a second NMOSFET 1027, a current source 1029, a first bleeding current source 1031, and a second bleeding current source 1033.

The first PMOSFET 1021 includes a source, a gate for receiving a positive input SmpP, and a drain. The first NMOSFET 1023 includes a drain connected to the drain of the first PMOSFET 1021, a gate connected to the drain of the first PMOSFET 1021, and a source connected to a ground potential. The second PMOSFET 1025 includes a source, a gate for receiving a negative input SmpM, and a drain. The second NMOSFET 1027 includes a drain connected to the drain of the second PMOSFET 1025, a gate connected to the drain of the first PMOSFET 1021, and a source connected to the ground potential, where the drain of the second NMOSFET 1027 provides VCTRL. The current source 1029 is connected between a power supply (e.g., VDD) and the sources of the first PMOSFET 1021 and the second PMOSFET 1025. The first bleeding current source 1031 is connected between VDD and the drain of the second NMOSFET 1027. The second bleeding current source 1033 is connected between the ground potential and the drain of the second NMOSFET 1027.

The first bleeding current source 1031 and the second bleeding current source 1033 are actual current sources in addition to a pre-charge circuit. The first bleeding current source 1031 and the second bleeding current source 1033 sink/source additional current from an output node of the $g_m$ stage device 207 so that the $g_m$ stage device 207 must provide an equal amount of current in an opposite direction to achieve zero net output current for a PLL locking state. Thus, an input of the $g_m$ stage device 207 must bear an input voltage instead of a zero input to support the current, which is typically called an input offset voltage. By manually controlling the input offset voltage, an output operating point may be adjusted when there is a zero voltage at the input of the $g_m$ stage device 207. Thus, the output voltage range of the $g_m$ stage device 207 is expanded in which an SS-PLL locking state may be searched.

Figure 10C:
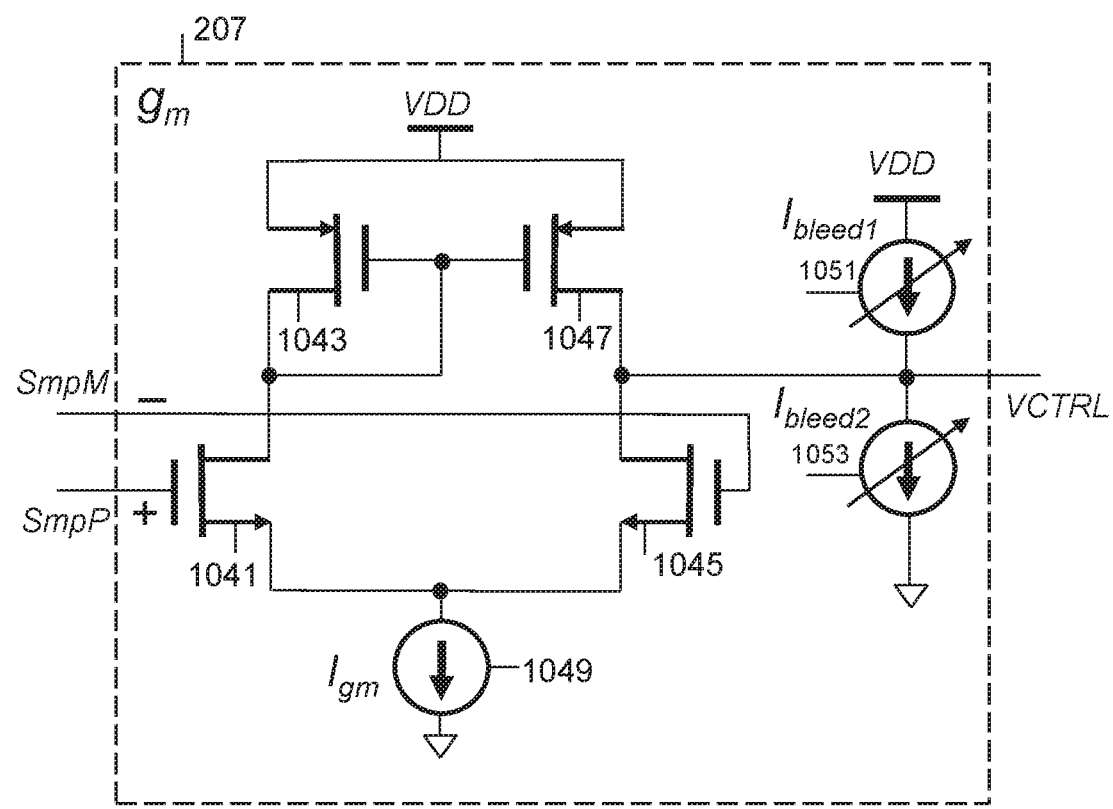
FIG. 10C illustrates another diagram of the present $g_m$ stage device of an SS-PLL with current bleeding, according to one embodiment.

FIG. 10C illustrates another diagram of a $g_m$ stage device 207 of an SS-PLL with current bleeding, according to one embodiment.

Referring to FIG. 10C, the $g_m$ stage device 207 includes a first NMOSFET transistor 1041, a first PMOSFET transistor 1043, a second NMOSFET transistor 1045, a second PMOSFET 1047, a current source 1049, a first bleeding current source 1051, and a second bleeding current source 1053.

The first NMOSFET 1041 includes a source, a gate for receiving a positive input SmpP, and a drain. The first PMOSFET 1043 includes a drain connected to the drain of the first NMOSFET 1041, a gate connected to the drain of the first NMOSFET 1041, and a source connected to a power supply (e.g., VDD). The second NMOSFET 1045 includes a source, a gate for receiving a negative input SmpM, and a drain. The second PMOSFET 1047 includes a drain connected to the drain of the second NMOSFET 1045, a gate connected to the drain of the first NMOSFET 1041, and a source connected to the power supply (e.g., VDD), where the drain of the second PMOSFET 1047 provides VCTRL. The current source 1049 is connected between a ground potential and the sources of the first NMOSFET 1041 and the second NMOSFET 1045. The first bleeding current source 1051 is connected between VDD and the drain of the second PMOSFET 1047. The second bleeding current source 1053 is connected between the ground potential and the drain of the second PMOSFET 1047.

The first bleeding current source 1051 and the second bleeding current source 1053 are actual current sources in addition to a pre-charge circuit. The first bleeding current source 1051 and the second bleeding current source 1053 sink/source additional current from an output node of the $g_m$ stage device 207 so that the $g_m$ stage device 207 must provide an equal amount of current in an opposite direction to achieve zero net output current for a PLL locking state. Thus, an input of the $g_m$ stage device 207 must bear an input voltage instead of a zero input to support the current, which is typically called an input offset voltage. By manually controlling the input offset voltage, an output operating point may be adjusted when there is a zero voltage at the input of the $g_m$ stage device 207. Thus, the output voltage range of the $g_m$ stage device 207 is expanded in which an SS-PLL locking state may be searched.

A locking range of an SS-PLL may be expanded by offset compensation of the $g_m$ stage device. An acquisition range of an automatic search is between VDD and an operating point of the $g_m$ stage device 207 minus an SSPD locking range. An input offset of the $g_m$ stage introduced by a mismatch may drive the $g_m$ output operating point to a higher voltage, which reduces the SS-PLL locking range. Some offset control may be added to mitigate mismatch. Current bleeding is added to the output of the $g_m$ stage device 207. By adding the bleeding current to extend the locking range, the operating point of the output of the $g_m$ stage device 207 may be controlled, for example, below 0.2V.

SS-PLL locking with a high reference frequency (e.g., 6 GHz) and a VCO with a tuning range less than a reference frequency (e.g., from 15 GHz to 21 GHz) may have only one harmonic solution for the VCO tuning range (e.g., $3x$ harmonic). The present apparatus and method may be used together with an FLL/digital-counter for frequency locking. However, this embodiment would be more robust without requiring a VCO to have a very fine resolution or a tight frequency accuracy before switching to an SS-PLL, and would be more resistant to frequency transient/disturbance or charge redistribution before switching to an SS-PLL.

According to one embodiment, an SS-PLL for enabling SS-PLL lock includes a $g_m$ stage within the SS-PLL, a switch connected between the output of the $g_m$ stage and an operating supply voltage (VDD), where the switch is initially closed to pre-charge the output voltage of the $g_m$ stage to VDD. Then, the switch is opened to allow the output voltage of the $g_m$ stage to drop to its operating voltage when a difference between the two input voltages of the $g_m$ stage is zero volts on average.

According to an embodiment, a switch at an output node VCTRL for a $g_m$ stage with an NMOSFET differential input stage is pre-charged to a desired voltage (e.g., 0V) by closing the switch. Then, the switch is opened to allow VCTRL to rise to the locking voltage.

Figure 11:
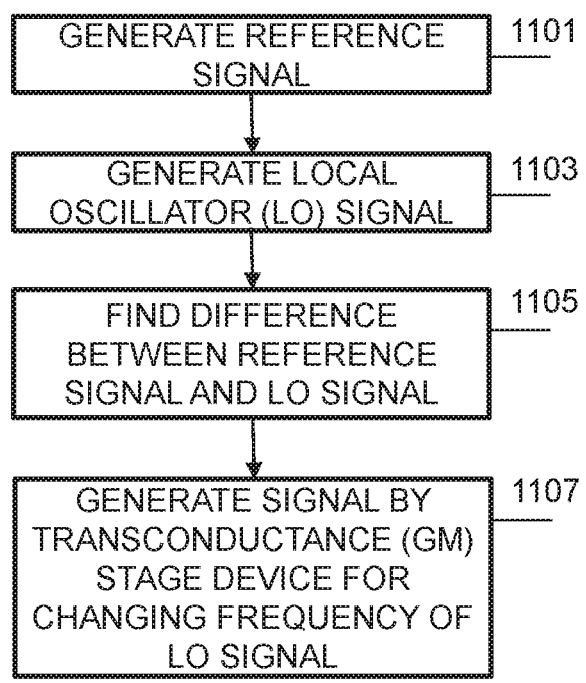
FIG. 11 illustrates a flowchart of the present method of providing automatic search for SS-PLL locking acquisition, according to one embodiment.

FIG. 11 illustrates a flowchart of a method of providing automatic search for SS-PLL locking acquisition, according to one embodiment.

Referring to FIG. 11, a voltage controlled oscillator (VCO), a local oscillating (LO) signal is generated by a VCO at 1101. At 1103, a reference signal of a PLL is generated. At 1105, a difference between the LO signal and the reference signal is determined by a sampling device connected to the VCO and the PLL. At 1107, an output for changing a frequency of the LO signal is generating by a $g_m$ stage device connected to the sampling device.

A resistor is connected to the $g_m$ stage device, a first capacitor is connected between the resistor and a ground potential, and a second capacitor is connected between the $g_m$ stage device and the ground potential. An output of the $g_m$ stage device may be pre-charged by a switch connected between the $g_m$ stage device and a power supply voltage (VDD).

In an embodiment, the $g_m$ stage device may be pre-charged to VDD and a coarse timing of the VCO may be performed. After coarse tuning is completed, the output of the $g_m$ stage device is pre-charged by a second switch connected between the $g_m$ stage device and a second power supply voltage different from VDD (e.g., VDD/2).

Coarse tuning of the VCO may be performed by a digital counter connected to the VCO that count the cycles of the LO signal and an FCAL device connected between the digital counter and the VCO that divides a tuning range of the LO signal so that the tuning range includes only one harmonic of the reference signal.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According various embodiments, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, the module may be implemented in a form of an application-specific integrated circuit (ASIC).

Various embodiments as set forth herein may be implemented as software including one or more instructions that are stored in a storage medium that is readable by a machine. For example, a processor of the machine may invoke at least one of the one or more instructions stored in the storage medium, and execute it, with or without using one or more other components under the control of the processor. This allows the machine to be operated to perform at least one function according to the at least one instruction invoked.

The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. An apparatus, comprising:
   a phase locked loop (PLL) configured to generate a reference signal;
   a sub-sampling PLL (SS-PLL) connected to the PLL and configured to sub-sample the reference signal; and
   a first pre-charge circuit connected to a sampling device of the SS-PLL and configured to allow an output voltage of the SS-PLL to transition to an operating voltage to indicate that a difference between two voltage inputs is zero on average.

2. The apparatus of claim 1, wherein the first pre-charge circuit connects the SS-PLL to a first power supply voltage (VDD).

3. The apparatus of claim 1, wherein the first pre-charge circuit connects the SS-PLL to a ground potential.

4. The apparatus of claim 2, further comprising a second pre-charge circuit connected between the sampling device of the SS-PLL and a second power supply voltage that is less than the first power supply voltage (VDD).

5. The apparatus of claim 1, wherein the SS-PLL comprises:
   a voltage controlled oscillator (VCO) configured to generate a local oscillating (LO) signal;
   the sampling device connected to the VCO and the PLL and configured to output a difference between the LO signal and the reference signal;
   a transconductance ($g_m$) stage device connected to the sampling device and configured to generate an output for changing a frequency of the LO signal; and
   a low-pass filter connected to the $g_m$ stage.

6. The apparatus of claim 1, further comprising a coarse timer connected to the VCO.

7. The apparatus of claim 5, where the $g_m$ stage device comprises:
   a current source including a first terminal connected to a power supply voltage (VDD) and a second terminal;
   a first p-channel metal oxide semiconductor field effect transistor (PMOSFET) including a drain, a gate connected to a first output of the sampling device, and a source connected to the second terminal of the current source;
   a second PMOSFET including a drain, a gate connected to a second output of the sampling device, and a source connected to the second terminal of the current source;
   a first n-channel metal oxide semiconductor field effect transistor (NMOSFET) including a drain connected to the drain of the first PMOSFET, a gate connected to the drain of the first PMOSFET, and a source connected to a ground potential; and
   a second NMOSFET including a drain connected to the drain of the second PMOSFET, a gate connected to the gate of the first NMOSFET, and a source connected to the ground potential.

8. The apparatus of claim 5, where the $g_m$ stage device comprises:
   a current source including a first terminal connected to a ground potential and a second terminal;
   a first n-channel metal oxide semiconductor field effect transistor (NMOSFET) including a drain, a gate connected to a first output of the sampling device, and a source connected to the second terminal of the current source;
   a second NMOSFET including a drain, a gate connected to a second output of the sampling device, and a source connected to the second terminal of the current source;
   a first p-channel metal oxide semiconductor field effect transistor (PMOSFET) including a drain connected to the drain of the first NMOSFET, a gate connected to the drain of the first NMOSFET, and a source connected to a power supply voltage (VDD); and
   a second PMOSFET including a drain connected to the drain of the second NMOSFET, a gate connected to the gate of the first PMOSFET, and a source connected to VDD.

9. The apparatus of claim 5, further comprising a bleed current source including a first terminal connected to a power supply voltage (VDD) and a second terminal connected to the output of the $g_m$ stage.

10. The apparatus of claim 5, further comprising a bleed current source including a first terminal connected to a ground potential and a second terminal connected to the output of the $g_m$ stage.

11. An apparatus, comprising:
a phase locked loop (PLL) configured to generate a reference signal;
a sub-sampling PLL (SS-PLL) connected to the PLL and configured to sub-sample the reference signal;
a first pre-charge circuit connected to a sampling device of the SS-PLL and configured to allow an output voltage of the SS-PLL to transition to an operating voltage to indicate that a difference between two voltage inputs is zero on average;
a frequency locking loop (FLL) connected to the SS-PLL;
a switch connected between the FLL and an output of the SS-PLL; and
a coarse tuner connected between the output of the SS-PLL and an input of the SS-PLL.

12. The apparatus of claim 11, wherein the first pre-charge circuit connects the SS-PLL to a power supply voltage (VDD).

13. The apparatus of claim 11, wherein the first pre-charge circuit connects the SS-PLL to a ground potential.

14. A method, comprising:
generating, by a phase locked loop (PLL), a reference signal;
sub-sampling, by a sub-sampling PLL (SS-PLL) connected to the PLL, the reference signal; and
causing, by a first pre-charge circuit connected to a sampling device of the SS-PLL, an output voltage of the SS-PLL to transition to an operating voltage to indicate that a difference between two voltage inputs is zero on average.

15. The method of claim 14, wherein the first pre-charge circuit connects the SS-PLL to a first power supply voltage (VDD).

16. The method of claim 14, wherein the first pre-charge circuit connects the SS-PLL to a ground potential.

17. The method of claim 15, further comprising pre-charging, by a second pre-charge circuit connected between the sampling device of the SS-PLL and a second power supply voltage that is less than the first power supply voltage (VDD), the output voltage of the SS-PLL.

18. The method of claim 14, wherein the SS-PLL comprises:
a voltage controlled oscillator (VCO) configured to generate a local oscillating (LO) signal;
the sampling device connected to the VCO and the PLL and configured to output a difference between the LO signal and the reference signal;
a transconductance ($g_m$) stage device connected to the sampling device and configured to generate an output for changing a frequency of the LO signal; and
a low-pass filter connected to the $g_m$ stage.

19. The method of claim 14, further comprising coarse tuning, by a coarse tuner connected to the VCO, the SS-PLL.

20. The method of claim 18, where the $g_m$ stage device comprises:
a current source including a first terminal connected to a power supply voltage (VDD) and a second terminal;
a first p-channel metal oxide semiconductor field effect transistor (PMOSFET) including a drain, a gate connected to a first output of the sampling device, and a source connected to the second terminal of the current source;
a second PMOSFET including a drain, a gate connected to a second output of the sampling device, and a source connected to the second terminal of the current source;
a first n-channel metal oxide semiconductor field effect transistor (NMOSFET) including a drain connected to the drain of the first PMOSFET, a gate connected to the drain of the first PMOSFET, and a source connected to a ground potential; and
a second NMOSFET including a drain connected to the drain of the second PMOSFET, a gate connected to the gate of the first NMOSFET, and a source connected to the ground potential.

21. The method of claim 18, where the $g_m$ stage device comprises:
a current source including a first terminal connected to a ground potential and a second terminal;
a first n-channel metal oxide semiconductor field effect transistor (NMOSFET) including a drain, a gate connected to a first output of the sampling device, and a source connected to the second terminal of the current source;
a second NMOSFET including a drain, a gate connected to a second output of the sampling device, and a source connected to the second terminal of the current source;
a first p-channel metal oxide semiconductor field effect transistor (PMOSFET) including a drain connected to the drain of the first NMOSFET, a gate connected to the drain of the first NMOSFET, and a source connected to a power supply voltage (VDD); and
a second PMOSFET including a drain connected to the drain of the second NMOSFET, a gate connected to the gate of the first PMOSFET, and a source connected to VDD.

22. The method of claim 18, further comprising bleeding, by a bleed current source including a first terminal connected to a power supply voltage (VDD) and a second terminal connected to the output of the $g_m$ stage, a current from the $g_m$ stage device.

23. The method of claim 18, further comprising bleeding, by a bleed current source including a first terminal connected to a ground potential and a second terminal connected to the output of the $g_m$ stage, a current from the $g_m$ stage device.

24. A method, comprising:
generating, by a phase locked loop (PLL), a reference signal;
sub-sampling, by a sub-sampling PLL (SS-PLL) connected to the PLL, the reference signal;
causing, by a first pre-charge circuit connected to a sampling device of the SS-PLL, an output voltage of the SS-PLL to transition to an operating voltage to indicate that a difference between two voltage inputs is zero on average;
locking, by a frequency locking loop (FLL) connected to the SS-PLL, a frequency of the SS-PLL;
switching, by a switch connected between the FLL and an output of the SS-PLL, the output of the SS-PLL to the FLL; and
coarse tuning, by a coarse tuner connected between the output of the SS-PLL and an input of the SS-PLL, the SS-PLL.

25. The method of claim 24, wherein the first pre-charge connects the SS-PLL to a power supply voltage (VDD).

26. The method of claim 24, wherein the first pre-charge circuit connects the SS-PLL to a ground potential.

* * * * *